(12) United States Patent
Bieselt

(10) Patent No.: US 9,938,135 B2
(45) Date of Patent: Apr. 10, 2018

(54) STRESS DECOUPLED PIEZORESISTIVE RELATIVE PRESSURE SENSOR AND METHOD FOR MANUFACTURING THE SAME

(71) Applicant: Infineon Technologies Dresden GmbH, Dresden (DE)

(72) Inventor: Steffen Bieselt, Stadt Wehlen (DE)

(73) Assignee: Infineon Technologies Dresden GmbH, Dreden (DE)

( * ) Notice: Subject to any disclaimer, the term of this patent is extended or adjusted under 35 U.S.C. 154(b) by 0 days.

(21) Appl. No.: 15/628,926

(22) Filed: Jun. 21, 2017

(65) Prior Publication Data
US 2017/0369306 A1    Dec. 28, 2017

(30) Foreign Application Priority Data

Jun. 27, 2016   (DE) .................. 10 2016 211 513

(51) Int. Cl.
| | | |
|---|---|---|
| *B81B 7/00* | (2006.01) | |
| *B81C 1/00* | (2006.01) | |
| *G01L 9/00* | (2006.01) | |

(52) U.S. Cl.
CPC ........ *B81B 7/0054* (2013.01); *B81C 1/00063* (2013.01); *B81C 1/00682* (2013.01); *B81B 2201/0264* (2013.01); *G01L 9/00* (2013.01)

(58) Field of Classification Search
CPC .......... B81B 7/0054; B81B 2201/0264; B81C 1/00063; B81C 1/00682; G01L 9/00
See application file for complete search history.

(56) References Cited

U.S. PATENT DOCUMENTS

| | | | |
|---|---|---|---|
| 9,409,764 B2 | 8/2016 | Reinmuth | |
| 2008/0224242 A1* | 9/2008 | Villa | .......... B81C 1/00158 257/419 |
| 2013/0062502 A1* | 3/2013 | Kautzsch | .......... H01L 31/062 250/206 |
| 2016/0122181 A1 | 5/2016 | Picco | |

FOREIGN PATENT DOCUMENTS

| | | |
|---|---|---|
| DE | 102010042113 | 4/2012 |
| DE | 102014214525 | 2/2016 |
| DE | 102015116353 | 5/2016 |

\* cited by examiner

*Primary Examiner* — Karen Kusumakar
(74) *Attorney, Agent, or Firm* — Harrity & Harrity, LLP

(57) ABSTRACT

Embodiments provide a MEMS (Micro Electro Mechanical System) pressure sensor comprising a semiconductor substrate, wherein the semiconductor substrate comprises a stress decoupling structure adapted to stress decouple a first portion of the semiconductor substrate from a second portion of the semiconductor substrate, wherein the first portion of the semiconductor substrate comprises a first buried empty space, wherein the second portion of the semiconductor substrate comprises a second buried empty space, and wherein the semiconductor substrate comprises a pressure channel fluidically connecting the first buried empty space and the second buried empty space.

25 Claims, 10 Drawing Sheets

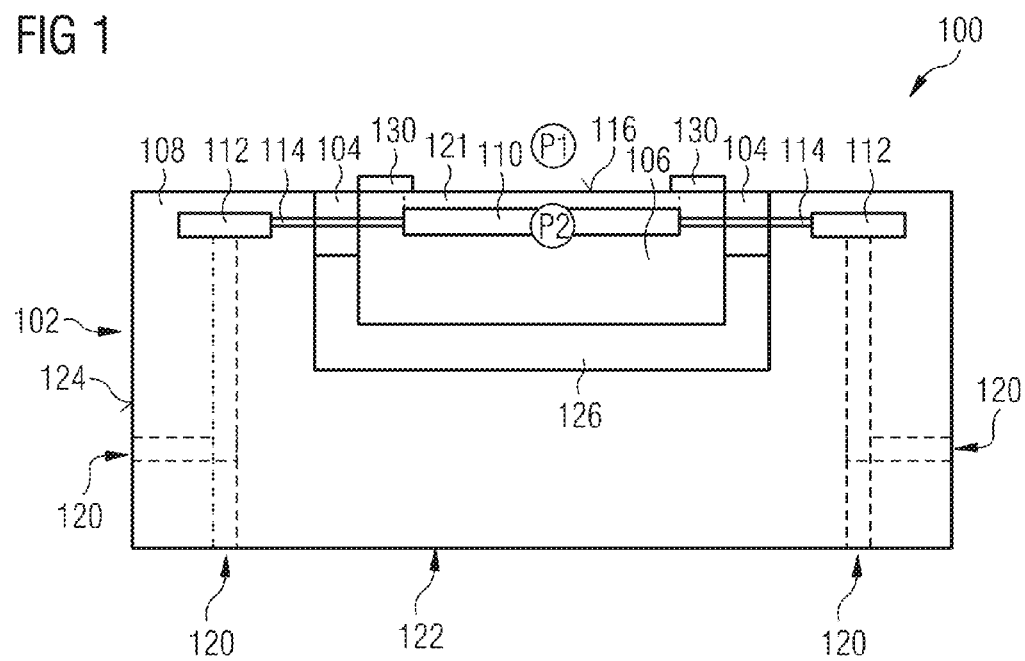

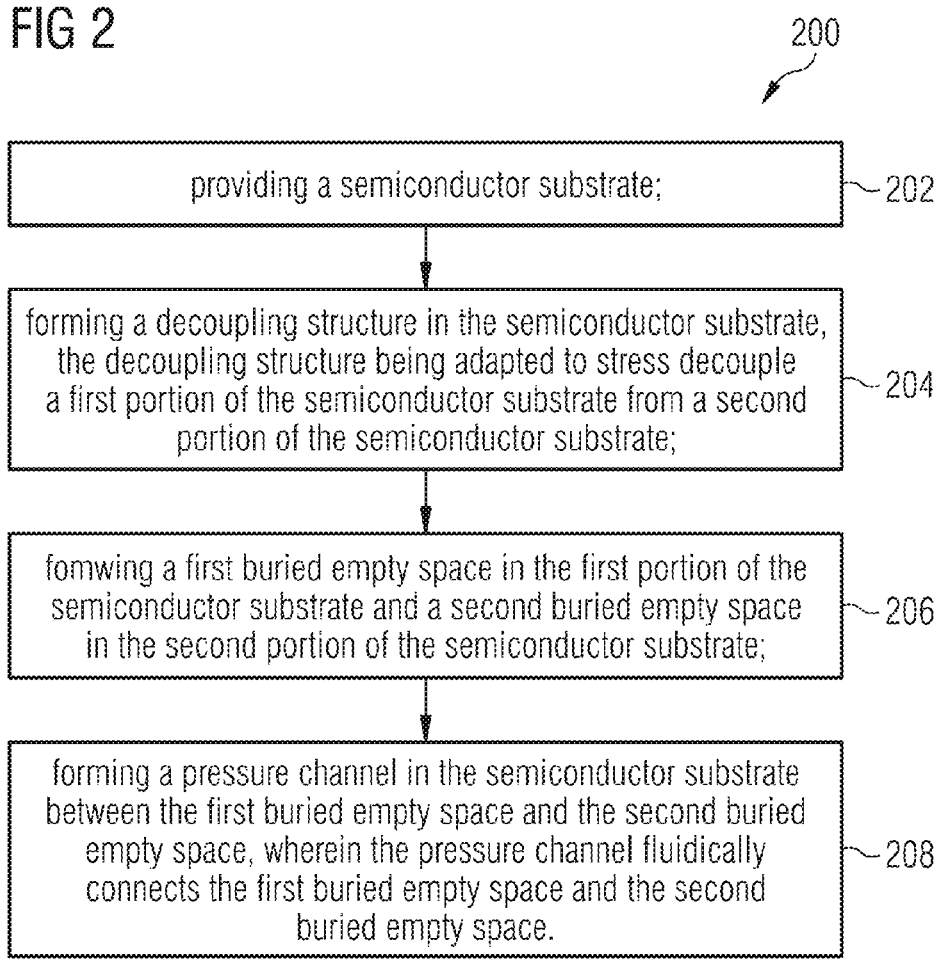

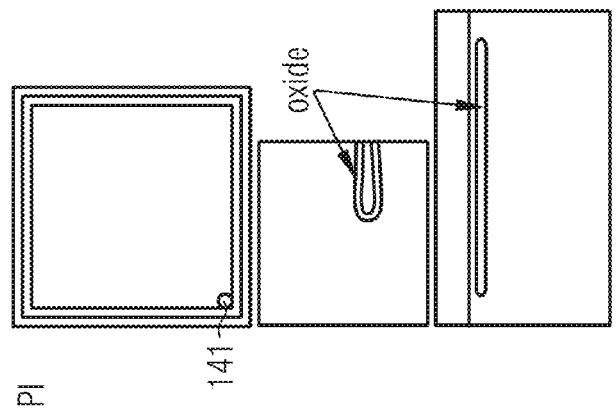
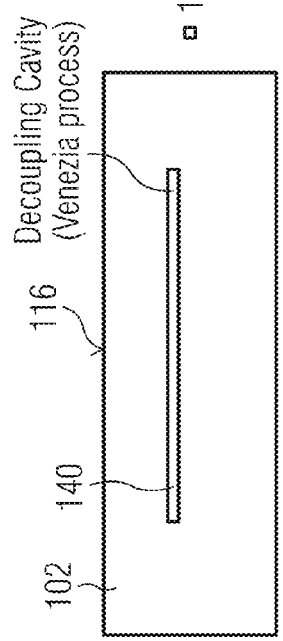
Fig. 3A
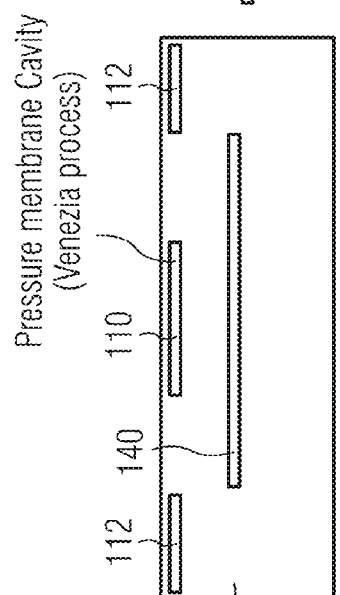
Fig. 3B
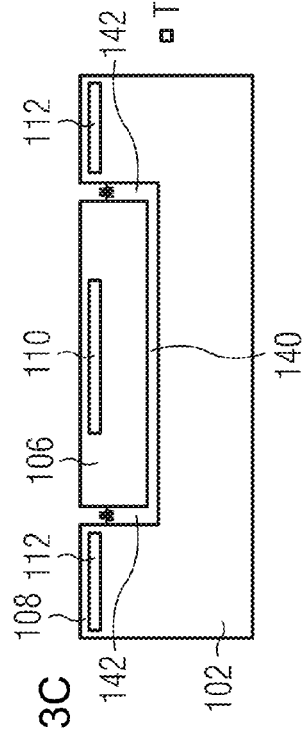
Fig. 3C

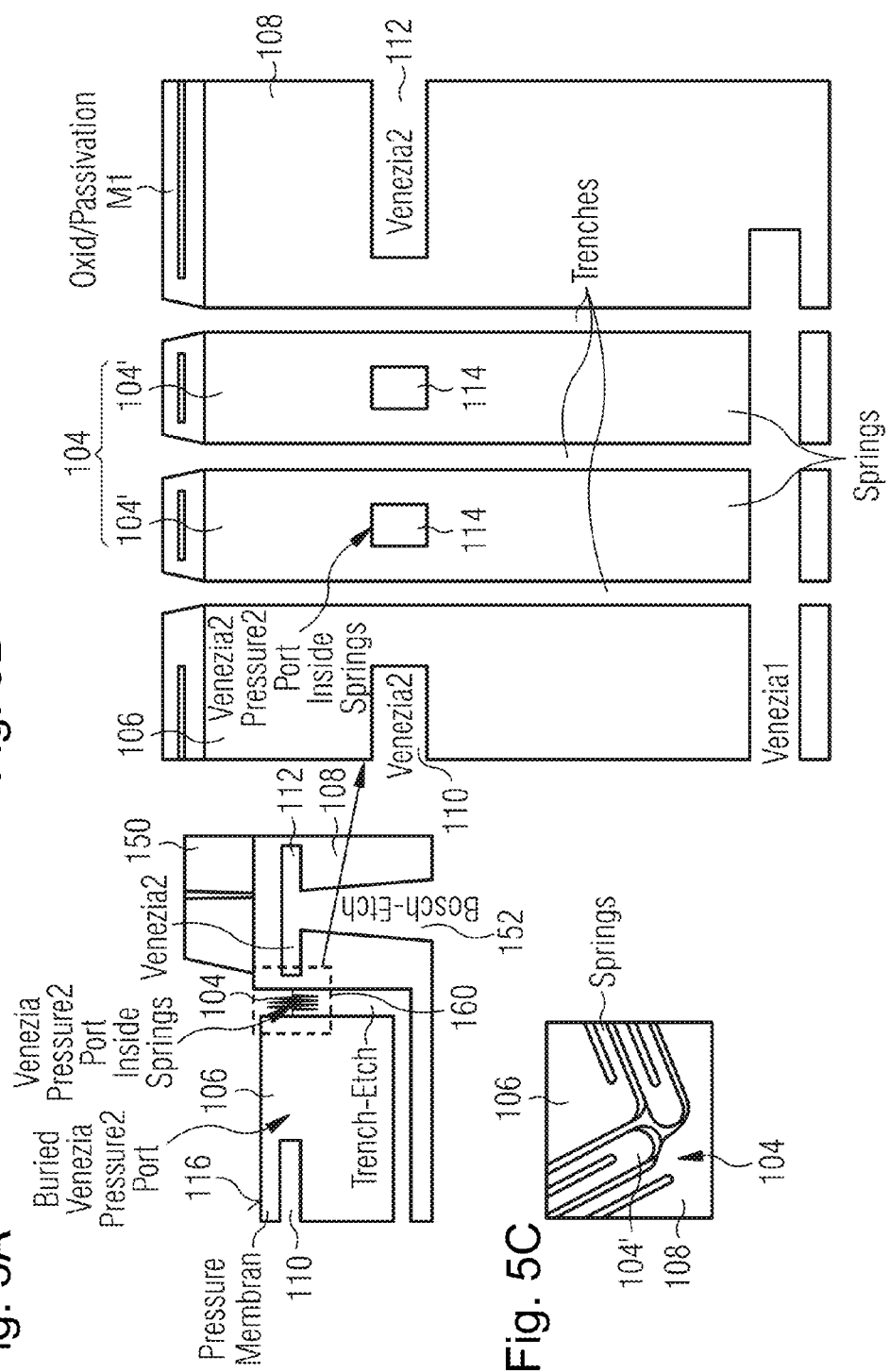

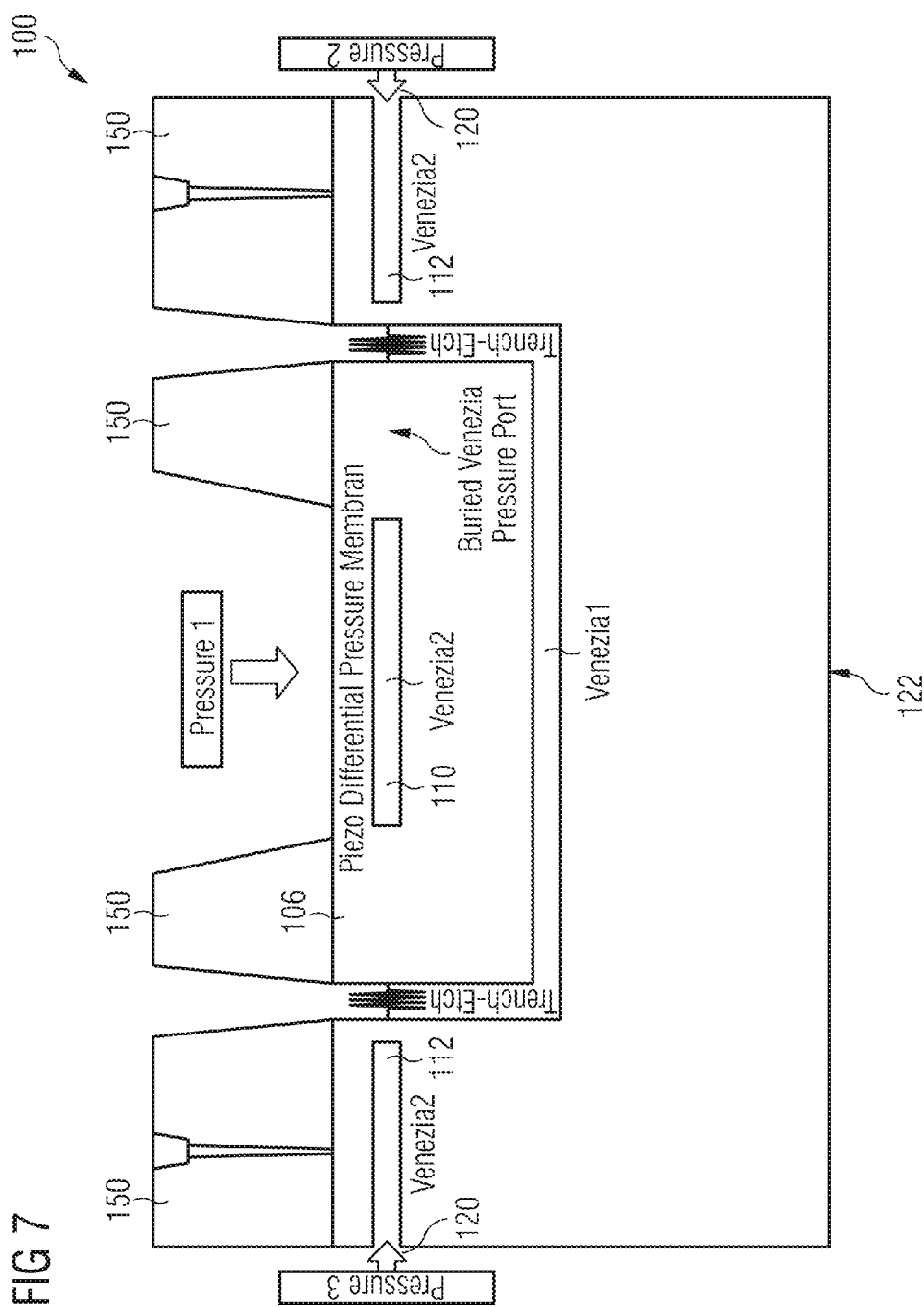

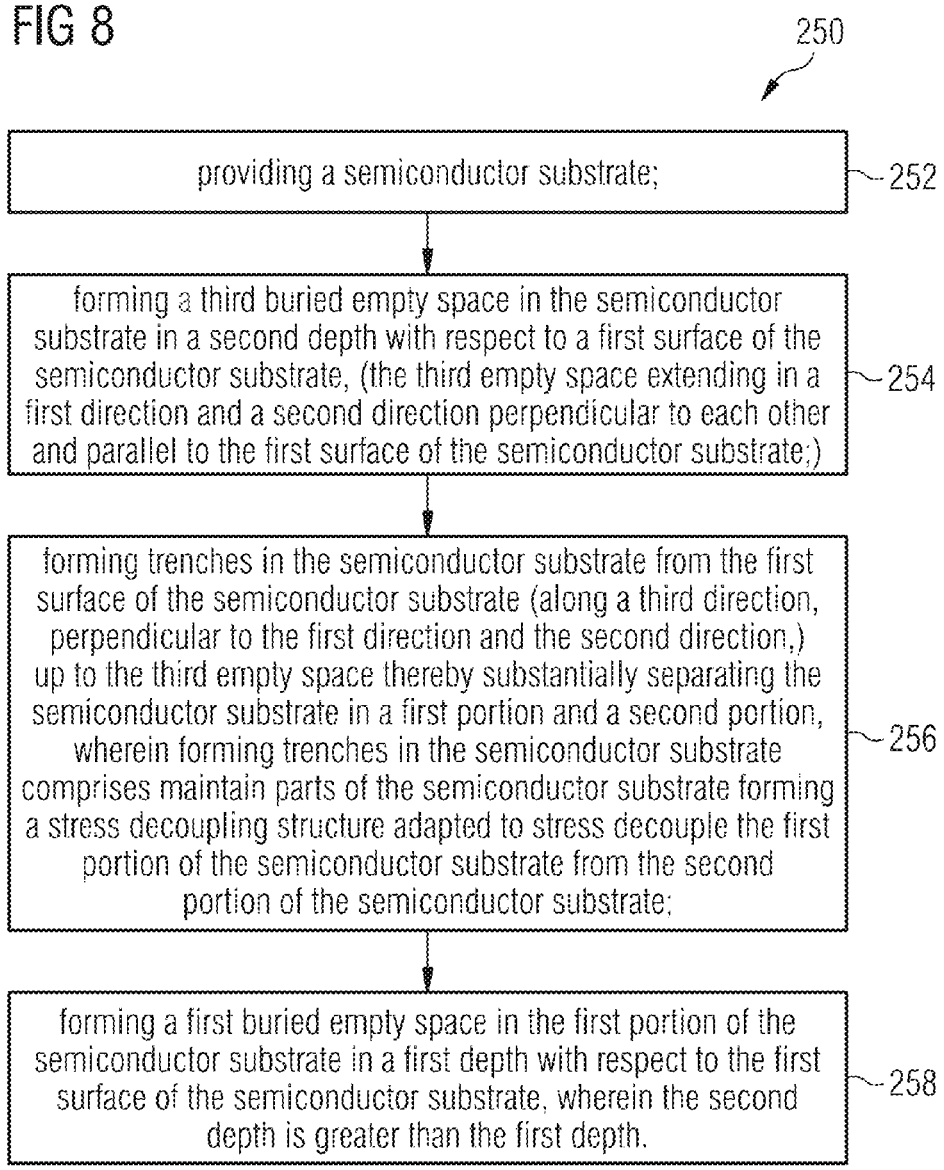

STRESS DECOUPLED PIEZORESISTIVE RELATIVE PRESSURE SENSOR AND METHOD FOR MANUFACTURING THE SAME

RELATED APPLICATION

This application claims priority under 35 U.S.C. § 119 to German Patent Application No. 102016211513.8, filed on Jun. 27, 2016, the content of which is incorporated by reference herein in its entirety.

TECHNICAL FIELD

Embodiments relate to a MEMS pressure sensor. Further embodiments relate to a method for manufacturing a relative MEMS pressure sensor. Further embodiments relate to a method for manufacturing an absolute MEMS pressure sensor. Some embodiments relate to a stress decoupled piezoresistive pressure sensor and a method for manufacturing the same.

BACKGROUND

Pressure sensors are used for measuring pressures typically of fluids, such as liquids or gases. Pressure sensors require a good stress decoupling.

SUMMARY

Embodiments provide a MEMS (Micro Electro Mechanical System) pressure sensor comprising a semiconductor substrate, wherein the semiconductor substrate comprises a stress decoupling structure adapted to stress decouple a first portion of the semiconductor substrate from a second portion of the semiconductor substrate, wherein the first portion of the semiconductor substrate comprises a first buried empty space, wherein the second portion of the semiconductor substrate comprises a second buried empty space, and wherein the semiconductor substrate comprises a pressure channel fluidically connecting the first buried empty space and the second buried empty space.

Further embodiments provide a method for manufacturing a MEMS pressure sensor, the method comprising:

providing a semiconductor substrate;

forming a decoupling structure in the semiconductor substrate, the decoupling structure being adapted to stress decouple a first portion of the semiconductor substrate from a second portion of the semiconductor substrate;

forming a first buried empty space in the first portion of the semiconductor substrate and a second buried empty space in the second portion of the semiconductor substrate; and forming a pressure channel in the semiconductor substrate between the first buried empty space and the second buried empty space, wherein the pressure channel fluidically connects the first buried empty space and the second buried empty space.

BRIEF DESCRIPTION OF THE DRAWINGS

FIG. 1 shows a schematic cross sectional view of a MEMS pressure sensor;

FIG. 2 shows a flowchart of a method for manufacturing a MEMS pressure sensor;

FIG. 3A shows a schematic cross sectional view of the MEMS pressure sensor after the step of providing the semiconductor substrate and an intermediate step of the step of forming the decoupling structure in the semiconductor substrate;

FIG. 3B shows a schematic cross sectional view of the MEMS pressure sensor after the step of forming a first buried empty space in the first portion of the semiconductor substrate and a second buried empty space in the second portion of the semiconductor substrate;

FIG. 3C shows a schematic cross sectional view of the MEMS pressure sensor after a further intermediate step of the step of forming the decoupling structure in the semiconductor substrate;

FIG. 5A shows a cutout view of the cross-sectional view of the MEMS pressure sensor shown in FIG. 4C;

FIG. 5B shows a cross-sectional view of the doted section of the MEMS pressure sensor shown in FIG. 5A;

FIG. 5C shows a perspective view of the springs or spring elements of the spring structure;

FIG. 7 shows a schematic cross sectional view of a MEMS pressure sensor without backside etch and second pressure port from chipside;

FIG. 8 shows a flowchart of a method for manufacturing an absolute MEMS pressure sensor;

DETAILED DESCRIPTION

Figure 3D:
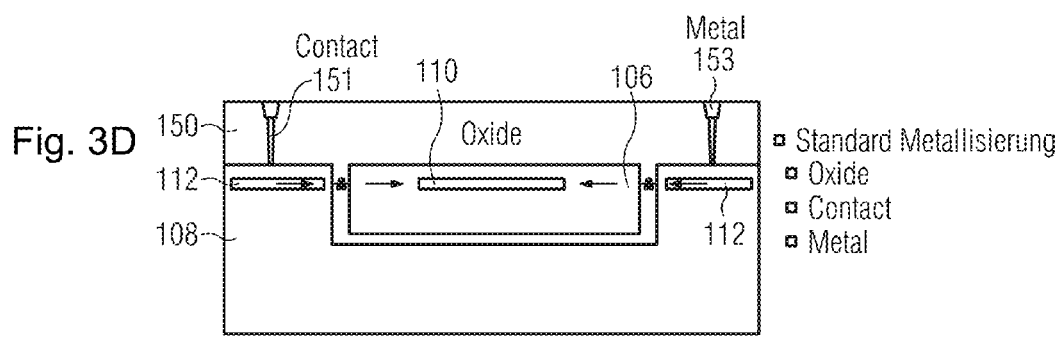
FIG. 3D shows a schematic cross sectional view of the MEMS pressure sensor after providing an isolation layer on the first portion of the semiconductor substrate and the second portion of the semiconductor substrate and forming contacts covered by a contact layer in the isolation layer.

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a schematic cross sectional view of a MEMS pressure sensor 100. The MEMS pressure sensor comprises a semiconductor substrate 102. The semiconductor substrate 102 comprises a stress decoupling structure 104 adapted to stress decouple a first portion 106 of the semiconductor substrate 102 from a second portion 108 of the semiconductor substrate 102. The first portion 106 of the semiconductor substrate 102 comprises a first buried empty space 110, wherein the second portion 108 of the semiconductor substrate 102 comprises a second buried empty space 112. Further, the semiconductor substrate 102 comprises a pressure channel 114 fluidically connecting the first buried empty space 110 and the second buried empty space 112.

As exemplarily shown in FIG. 1, the first buried empty space 110 can (primarily) extend along a lateral direction substantially perpendicular to a first surface 116 of the semiconductor substrate 102. In detail, the first buried empty space 110 can extend along a first direction (first lateral direction) and a second direction (second lateral direction) perpendicular to each other and parallel to the first surface 116 of the semiconductor substrate 102. Further, the first buried empty space 110 can extend along a third direction (vertical direction) perpendicular to the first surface 116 of the semiconductor substrate 102. Thereby, a dimension of the first buried empty space 110 along at least one out of the first direction and the second direction can be at least by a factor of 3 (or 5, or 7, or 10, or 20) greater than a dimension of the first buried empty space 110 along the third direction.

Similarly, the second buried empty space 112 can (primarily) extend along a lateral direction substantially perpendicular to a first surface 116 of the semiconductor substrate 102. In detail, the second buried empty space 112 can extend along a first direction (first lateral direction) and a second direction (second lateral direction) perpendicular to each other and parallel to the first surface 116 of the semiconductor substrate 102. Further, the second buried empty space 112 can extend along a third direction (vertical direction) perpendicular to the first surface 116 of the semiconductor substrate 102. Thereby, a dimension of the second buried empty space 112 along at least one out of the first direction and the second direction can be at least by a factor of 3 (or 5, or 7, or 10, or 20) greater than a dimension of the second buried empty space 112 along the third direction.

The first buried empty space 110 and the second buried empty space 112 can be arranged at the same depth within the respective portions 106 and 108 of the semiconductor substrate 102 with respect to the first surface 116 of the semiconductor substrate.

The stress decoupling structure 104 can be a spring structure adapted to spring-load the first portion 116 of the semiconductor substrate 102.

The pressure channel 114 that fluidically connects the first empty space 110 and the second empty space 112 can be arranged within the stress decoupling structure 104, e.g. within a spring or spring elements of the spring structure.

The first portion 106 of the semiconductor substrate 102 and the second portion 108 of the semiconductor substrate 102 can be separated, spaced apart, or mechanically decoupled, e.g., by a gap, cavity or opening, from each other.

The first portion 106 of the semiconductor substrate 102 and the second portion 108 of the semiconductor substrate 102 can be mechanically connected only or exclusively via the stress decoupling structure 104.

The first portion 106 of the semiconductor substrate 102 and the second portion 108 of the semiconductor substrate 102 can be portions of the same semiconductor substrate. For example, during manufacturing, the first portion 106 of the semiconductor substrate 102 and the second portion 108 of the semiconductor substrate 102 can be formed out of the same semiconductor substrate 102, or in other words, the first portion 106 of the semiconductor substrate 102 and the second portion 108 of the semiconductor substrate 102 can be obtained by structuring the semiconductor substrate 102.

Further, the stress decoupling structure 104 also can be part of the semiconductor substrate. For example, during manufacturing, the stress decoupling structure 104 can be formed out of the semiconductor substrate 102, or in other words, the stress decoupling structure 104 can be obtained by structuring the semiconductor substrate 102.

Thus, the first portion 106 of the semiconductor substrate 102, the second portion 108 of the semiconductor substrate 102 and the stress decoupling structure 104 can be parts or portions of the same semiconductor substrate which merge seamlessly.

The second portion 108 of the semiconductor substrate 102 can comprise a U-shaped cavity 126 in which the first portion 106 of the semiconductor substrate 102 is stress decoupledly loaded or mounted by the stress decoupling structure 104. The U-shaped cavity can be obtained, for example, by forming a third buried empty space in the semiconductor substrate 102 forming trenches in the semiconductor substrate from the first surface 116 of the semiconductor substrate up to the third empty space thereby substantially separating the semiconductor substrate 102 in the first portion 106 and the second portion 108 while maintaining parts of the semiconductor substrate 102 which form the stress decoupling structure 104.

The pressure sensor 100 can be configured to sense a pressure by sensing a piezo resistance of the first portion 106 of the semiconductor substrate 102 at least in a region 128 above the first empty space 110, i.e. in a region that laterally extends along the first empty space 110 and vertically extends between the first surface 116 of the first portion 106 of the semiconductor substrate 102 and the first empty space 110. Thus, the region 128 above the first empty space 110 can be a piezo resistive pressure membrane.

The MEMS pressure sensor 100 can further comprise contacts 130 arranged on the first portion 106 of the semiconductor substrate 102 to contact the piezo resistive pressure membrane 128, such that a piezo resistance of the piezo resistive pressure membrane 128 is measureable.

The MEMS pressure sensor 100 can be a relative pressure sensor configured to sense a relative pressure between a first pressure P1 present in the surroundings of the first portion 106 of the semiconductor substrate 102 and a second pressure P2 present in the first empty space 110 within the first portion 106 of the semiconductor substrate 102.

The semiconductor substrate 102 can further comprise a pressure port 120 fluidically connected to the second empty space 112. Thus, a pressure (i.e. the second pressure P2) applied to or present at the pressure port 120 is also present in the first empty space 110. The pressure port 120 can be arranged at a second surface 122 or a side surface 124 of the semiconductor substrate 102.

FIG. 2 shows a flowchart of a method 200 for manufacturing a MEMS pressure sensor 100. The method 200 comprises a step 202 of providing a semiconductor substrate 102. Further, the method 200 comprises a step 204 of forming a decoupling structure 104 in the semiconductor substrate 102, the decoupling structure 104 being adapted to stress decouple a first portion 106 of the semiconductor substrate 102 from a second portion 108 of the semiconductor substrate 102. Further, the method 200 comprises a step 206 of forming a first buried empty space 110 in the first portion 106 of the semiconductor substrate 102 and a second buried empty space 112 in the second portion 108 of the semiconductor substrate 102. Further, the method 200 comprises a step 208 of forming a pressure channel 114 in the semiconductor substrate 102 between the first buried empty space 110 and the second buried empty space 112, wherein the pressure channel fluidically connects the first buried empty space 110 and the second buried empty space 112.

The first empty space 108 and the second empty space 110 can be manufactured using a so called Venezia process, i.e., a silicon on nothing process or an empty space on silicon process.

Also the pressure channel can be formed using the Venezia process. Thus, the first empty space 108, the second empty space 110 and the pressure channel 114 can be manufactured simultaneously using the same Venezia process, or in other words, in one Venezia process step.

Subsequently, the method 200 for manufacturing a MEMS pressure sensor 100 will be described in further detail making reference to FIGS. 3a to 3d which cross sectional views of the MEMS pressure sensor after different manufacturing steps, or in other words, the processing scheme and some inline pictures for a better understanding (main process blocks of a relative pressure sensor with double Venezia process).

As will become clear from the following discussion, embodiments combine structuring blocks and process sequences in a way that an improved (or even maximum) stress decoupling can be reached with reduced (or even minimum) process complexity.

FIG. 3A shows a schematic cross sectional view of the MEMS pressure sensor 100 after the step 202 of providing the semiconductor substrate 102 and an intermediate step of the step 204 of forming the decoupling structure 104 in the semiconductor substrate 102. Forming the decoupling structure 104 can comprise forming a third buried empty space 140 in the semiconductor substrate 102 in a second depth with respect to the first surface 116 of the semiconductor substrate 102.

The third buried empty space 140 can be formed using a first Venezia process with, for example, 15 µm to 20 µm insitu EPI (epitaxy, or epitaxial layer/film).

In other words, FIG. 3A shows a formation of a 1st silicon-on-nothing (SON) structure with insitu EPI (epitaxy, or epitaxial layer/film).

Further, FIG. 3A shows a hole 141 in the silicon-on-nothing (SON) structure. The hole 141 can result from an initial trench geometry. Hence, after the Venezia process, the empty space (cavity) is already opened and no additional trench etch is required. Thus, within the empty space an oxide can be provided which may serve as stop layer for a later backside Bosch etch.

FIG. 3B shows a schematic cross sectional view of the MEMS pressure sensor 100 after the step 206 of forming a first buried empty space 110 in the first portion 106 of the semiconductor substrate 102 and a second buried empty space 112 in the second portion 108 of the semiconductor substrate 102.

The first buried empty space 110 and the second buried empty space 112 can be formed within the respective portions 108,110 of the semiconductor substrate such that the first buried empty space 110 and the second buried empty space 112 are laterally spaced apart from each other.

Further, the first buried empty space 110 and the second buried empty space 112 can be formed in a first depth within the respective portions 108,110 of the semiconductor substrate with respect to the first surface 116 of the semiconductor substrate, wherein the first depth is smaller than the second depth such that the first empty space 110 and the third empty space 140 are spaced apart from each other (in a vertical direction).

The first buried empty space 110 and the third buried empty space 140 can be formed in the semiconductor substrate such that the third buried empty space 140 protrudes under the first buried empty space 110. In other words, the first buried empty space 110 and the third buried empty space 140 can be formed in the semiconductor substrate such that a projection of an area of the first buried empty space 110 on an area of the third buried empty space 140 is completely enclosed by the area of the third buried empty space 140.

The first empty space 110 can be formed within the first portion 106 of the semiconductor substrate 102 such that the region above the first empty space 110, i.e. the region that laterally extends along the first empty space 110 and vertically extends between the first surface 116 of the first portion 106 of the semiconductor substrate 102 and the first empty space 110, forms a piezo resistive pressure membrane.

Before or after forming the first buried empty space 110 and the second buried empty space 112 the pressure channel pressure channel 114 can be formed in the semiconductor substrate 102 between the first buried empty space 110 and the second buried empty space 112, such that the pressure channel fluidically connects the first buried empty space 110 and the second buried empty space 112.

The first buried empty space 110 and the second buried empty space 112 can be formed using a second Venezia process, for example, with pressure port and oxidation holes. In detail, the first buried empty space 110 and the second buried empty space 112 can be formed using a second Venezia process with holes from the surface 116 to the first buried empty space 110 and/or the second buried empty space 112 that can be used to make a buried oxide inside the first buried empty space 110 and/or the second buried empty space 112 for later Bosch etch stop. Beside the pressure membrane, there are buried Venezia pressure ports/tubes with a spring design (see FIG. 5B).

In other words, FIG. 3B shows a formation of a 2nd silicon-on-nothing (SON) structure with oxide liner inside of the cavity.

Further, FIG. 3B shows a scanning electron microscopy cross sectional image of the pressure sensor 100 in which an oxide layer on the third buried empty space 140 can be seen.

FIG. 3C shows a schematic cross sectional view of the MEMS pressure sensor 100 after a further intermediate step of the step 204 of forming the decoupling structure 104 in the semiconductor substrate 102. Forming the decoupling structure 104 can comprise forming trenches 142 in the semiconductor substrate 102 from the first surface 116 of the semiconductor substrate 102 up to the third empty space 140 thereby substantially separating the semiconductor substrate 102 in the first portion 108 and the second portion 110 while maintaining parts of the semiconductor substrate 102 forming the stress decoupling structure 104.

As shown in FIG. 3C, the stress decoupling structure 104 can be a spring structure. Thereby, the pressure channel fluidically connecting the first buried empty space 110 and the second buried empty space 112 can be formed in the semiconductor substrate 102 (e.g., before forming the spring structure) such that the pressure channel runs through (or is arranged within) spring elements of the spring structure.

In other words, a trench etch (TR) can be used for spring-/stress decoupling. In detail, a trench etch that etch beside the pressure channel (buried Venezia pressure ports/ tubes) can be used to build the decoupling springs with the buried pressure channel (pressure ports/tubes) inside (see also FIG. 4B).

In other words, FIG. 3C shows a deep trench etch for stress decoupling spring beside 2nd pressure port.

Further, FIG. 3C shows a scanning electron microscopy cross sectional image of the pressure sensor 100 in which an oxide layer on the third buried empty space 140 can be seen.

FIG. 3D shows a schematic cross sectional view of the MEMS pressure sensor after providing an isolation layer (e.g., oxide layer) 150 on the first portion 106 of the semiconductor substrate 102 and the second portion 108 of the semiconductor substrate and forming contacts 151 covered by a contact layer (e.g., metal) 153 in the isolation layer 150.

Figure 3E:
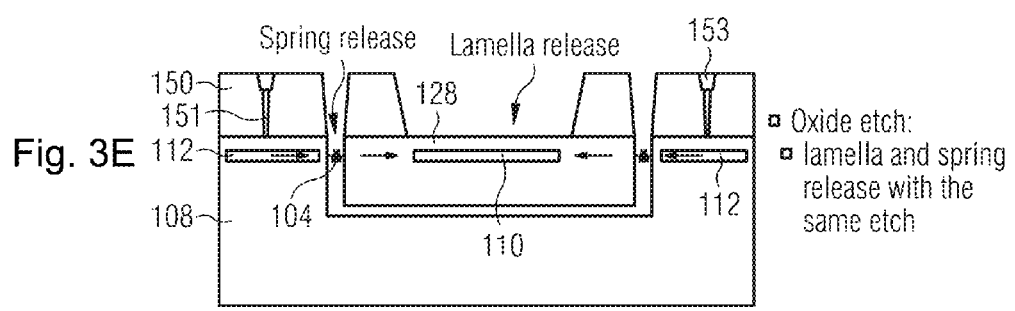
FIG. 3E shows a schematic cross sectional view of the MEMS pressure sensor after partially opening the isolation layer to expose the spring structure and the membrane.

FIG. 3E shows a schematic cross sectional view of the MEMS pressure sensor after partially opening the isolation layer 151 to expose the spring structure 104 and the membrane (e.g., lamella) 128. Thereby, the spring structure 104 and the membrane (lamella) can be released with the same etch (e.g., oxide etch).

Figure 3F:
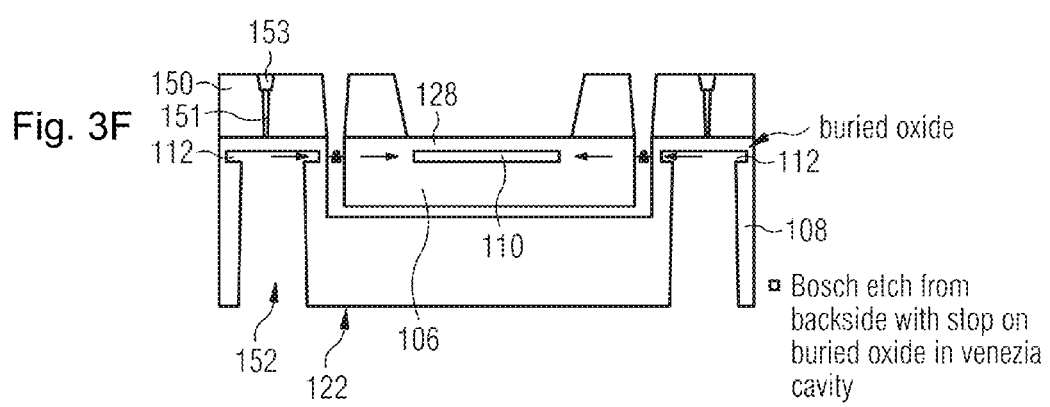
FIG. 3F shows a schematic cross sectional view of the MEMS pressure sensor after forming a pressure port in the semiconductor substrate rom the second surface of the semiconductor substrate up to the second empty space.

FIG. 3F shows a schematic cross sectional view of the MEMS pressure sensor 100 after forming a pressure port 152 in the semiconductor substrate 102 from the second surface 122 of the semiconductor substrate up to the second empty space 112. For example, a Bosch etch from the backside 122 of the semiconductor substrate with stop on a buried oxide in the second empty space (Venezia cavity) can be used.

In other words, FIG. 3D shows contact oxide deposition, metal layer (also on top of the spring), front side lamella and spring release, backside etch for 2nd pressure port with stop on buried oxide (see, for example, FIG. 6)/or pressure port to chipside (see, for example, FIG. 7).

Further, FIG. 3D shows a perspective view on the MEMS pressure sensor 100 after manufacturing.

A basic implementation like shown in FIGS. 3A to 3D is shown subsequently in FIGS. 4A to 4C in cross sectional and top/bottom view for better a understanding. Further, FIG. 5 shows details for piezo-resistor contact and second pressure port inside of decoupling springs.

Figure 4A:
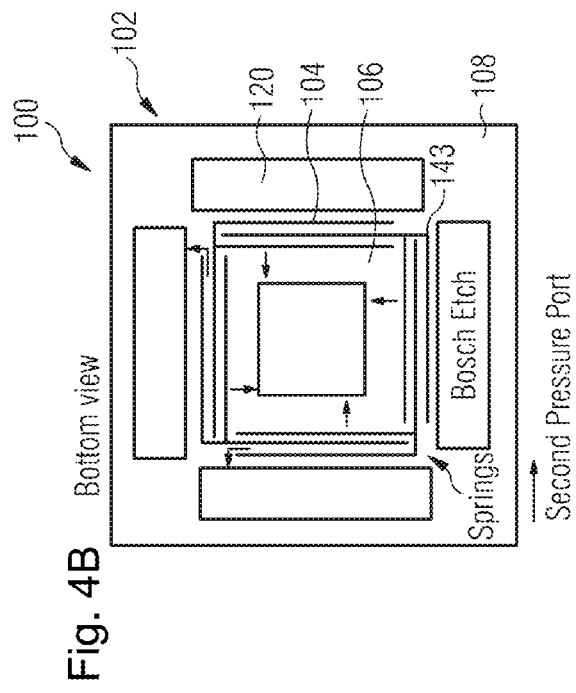
FIG. 4A sows a top view of the MEMS pressure sensor showing the piezo resistive pressure membrane and the spring structure.

FIG. 4A shows a top view of the MEMS pressure sensor 100 showing the piezo resistive pressure membrane 128 (above the first buried empty space 110) and the spring structure 104. The spring structure 104 adapted to stress decouple (spring load) the first portion 106 of the semiconductor substrate 102 from the second portion 108 of the semiconductor substrate 102 can be obtained, for example, by forming slots in the semiconductor substrate in upper portions of the trenches, to obtain (bar-shaped) spring elements which together form the spring structure.

As already mentioned, the pressure channel connecting the first buried empty space 110 and the second buried empty space 112 can be arranged within the spring structure, or in more precisely, within spring elements of the spring structure. In FIG. 4A, a course of the pressure channel within the spring structure 104 is indicated by arrows.

Figure 4B:
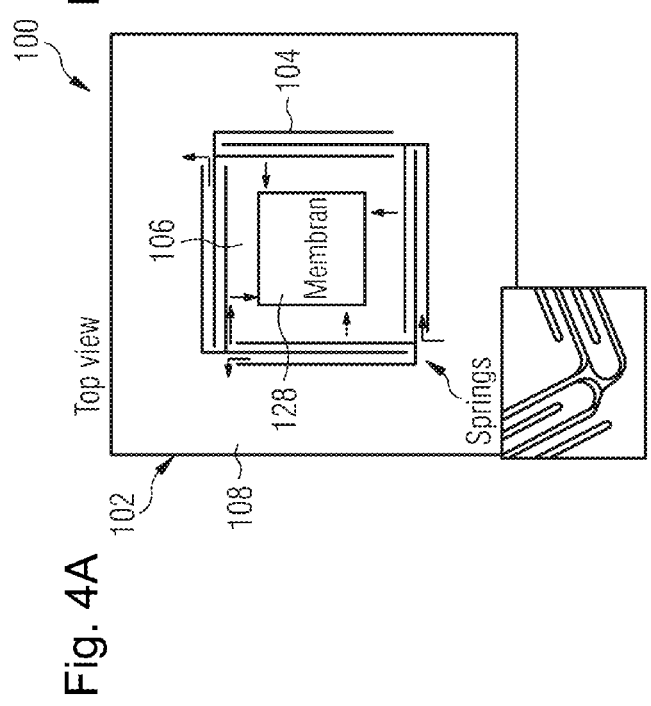
FIG. 4B shows a bottom view of the MEMS pressure sensor showing the pressure port and the spring structure.

FIG. 4B shows a bottom view of the MEMS pressure sensor 100 showing the pressure port (e.g., second pressure port; e.g., obtained using a bosch etch) and the spring structure 104. Also in FIG. 4B, the course of the pressure channel within the spring structure 104 is indicated by arrows. Further, in FIG. 4B trenches 143 forming the spring structure 104 are shown. The trenches 143 may be obtained by a trench etch that may etch beside the buried pressure channel (buried Venezia pressure ports/tubes) with a spring design.

Figure 4C:
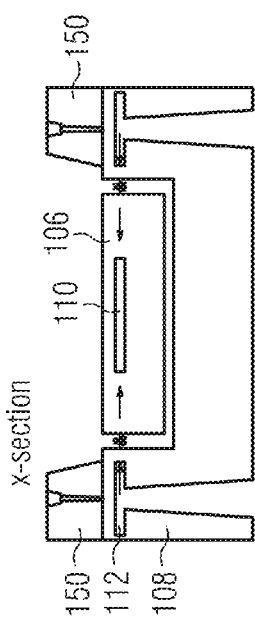
FIG. 4C shows a cross-sectional view of the MEMS pressure sensor after manufacturing.

FIG. 4C shows a cross-sectional view of the MEMS pressure sensor 100 after manufacturing. Compared to the cross-sectional view of the MEMS pressure sensor 100 shown in FIG. 3A, in FIG. 4C further the course of the pressure channel is indicated by arrows.

FIG. 5A shows a cutout view of the cross-sectional view of the MEMS pressure sensor 100 shown in FIG. 4C.

FIG. 5B shows a cross-sectional view of the doted section 160 of the MEMS pressure sensor 100 shown in FIG. 5A. As indicated in FIG. 5B, the pressure channel fluidically connecting the first buried empty space 110 and the second buried empty space 112 can be arranged inside the springs 104' or spring elements 104' (or run through the springs 104' or spring elements 104') of the spring structure 104. In other words, the pressure channel (e.g., buried Venezia pressure ports/tubes) can comprise a spring design. Further, as indicated in FIG. 5B, the springs 104' can be formed by a trench etch.

FIG. 5C shows a perspective view of the springs 104' or spring elements 104' of the spring structure 104.

Figure 6:
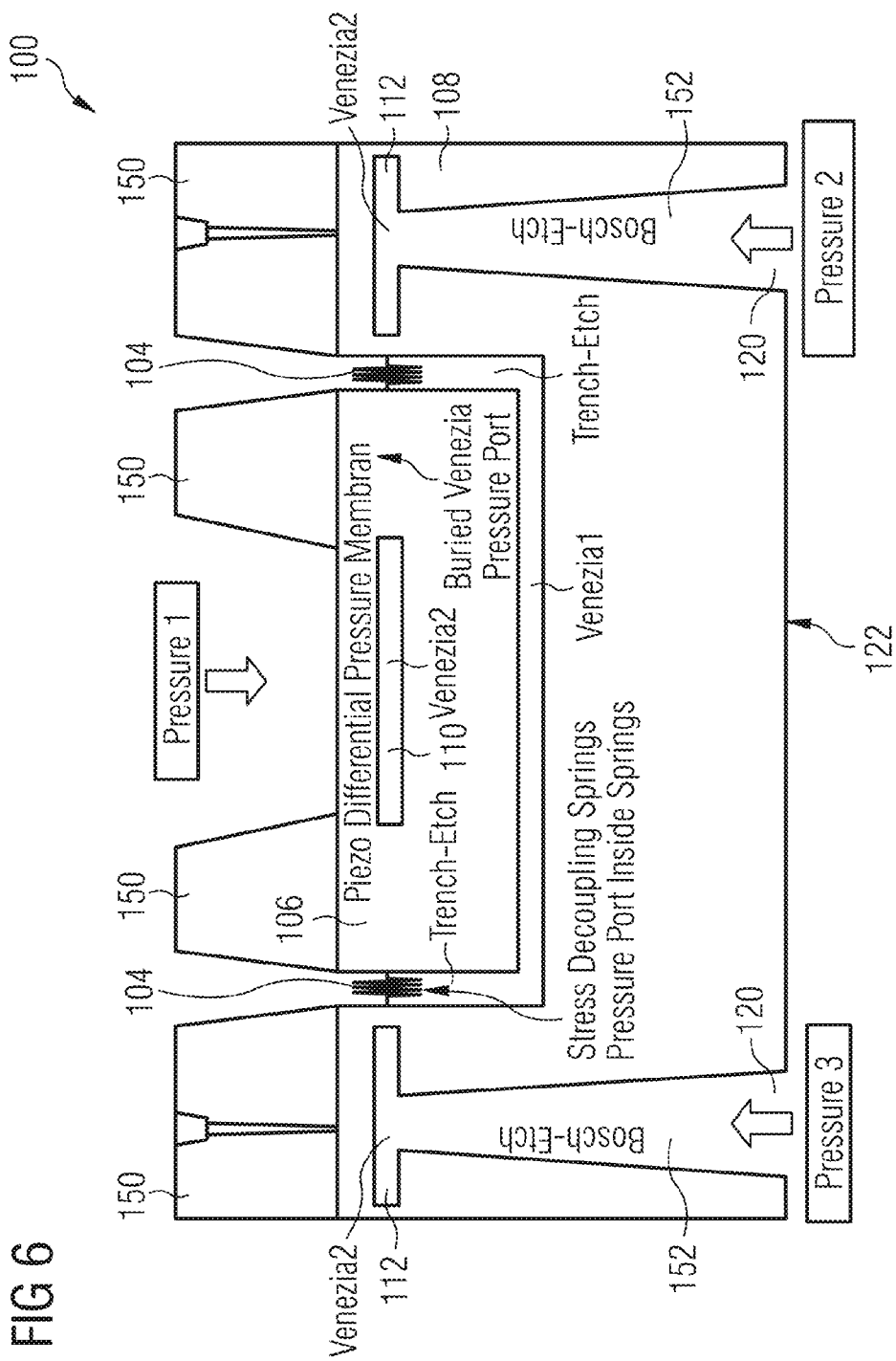
FIG. 6 shows a schematic cross sectional view of a MEMS pressure sensor with backside etch and second pressure port from backside.

FIG. 6 shows a schematic cross sectional view of a MEMS pressure sensor 100 with backside 122 etch and second pressure port 120 from backside. As already mentioned, the MEMS pressure sensor 100 can be a relative pressure sensor configured to sense a relative pressure between a first pressure present in the surroundings of the first portion 106 of the semiconductor substrate 102 and a second pressure present in the first empty space 110 within the first portion 106 of the semiconductor substrate 102, wherein the second pressure is applied to a pressure port 120 arranged at a second surface 122 of the semiconductor substrate and fluidically connected to the second empty space 112.

FIG. 7 shows a schematic cross sectional view of a MEMS pressure sensor 100 without backside etch and second pressure port 120 from chipside. In contrast to FIG. 6, the pressure port 120 to which the second pressure can be applied is arranged on a side surface of the semiconductor substrate.

FIG. 8 shows a flowchart of a method 250 for manufacturing an absolute MEMS pressure sensor 100. The method comprises a step 252 of providing a semiconductor substrate 102. Further, the method 250 comprises a step 254 of forming a third buried empty space 140 in the semiconductor substrate 102 in a second depth with respect to a first surface 116 of the semiconductor substrate 102 (the third empty space extending in a first direction and a second direction perpendicular to each other and parallel to the first surface of the semiconductor substrate). Further, the method 250 comprises a step 256 of forming trenches 142 in the semiconductor substrate 102 from the first surface 116 of the semiconductor substrate 102 (along a third direction, perpendicular to the first direction and the second direction) up to the third empty space 140 thereby substantially separating the semiconductor substrate in a first portion 106 and a second portion 108 while maintaining parts of the semiconductor substrate 102 forming a stress decoupling structure 104 adapted to stress decouple the first portion of the semiconductor substrate 106 from the second portion 108 of the semiconductor substrate 102. Further, the method 250 comprises a step 255 of forming a first buried empty space 110 in the first portion 106 of the semiconductor substrate 102 in a first depth with respect to the first surface 116 of the semiconductor substrate 102, wherein the second depth is greater than the first depth.

Figure 9A:
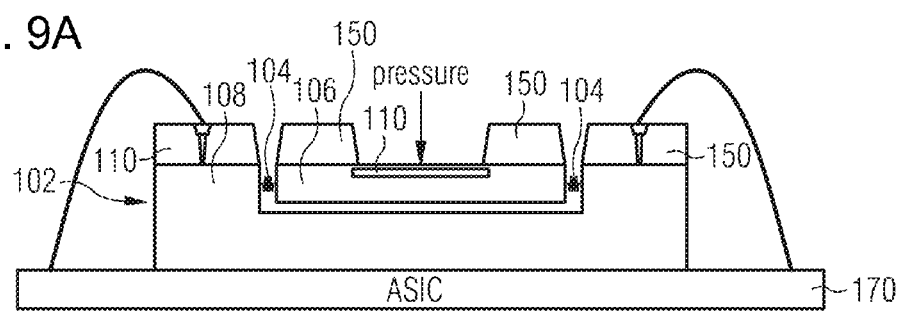
FIG. 9A shows a cross-sectional view of the absolute MEMS pressure sensor obtained with the method for manufacturing shown in FIG. 8.

FIG. 9A shows a cross-sectional view of the absolute MEMS pressure sensor 100 obtained with the method for manufacturing shown in FIG. 8. The MEMS pressure sensor 100 comprises a semiconductor substrate 102 comprising a stress decoupling structure 104 adapted to stress decouple a first portion 106 of the semiconductor substrate 102 from a second portion 108 of the semiconductor substrate 102. The first portion 106 of the semiconductor substrate 102 comprises a first buried empty space 110.

As shown in FIG. 9A, the absolute MEMS pressure sensor 100 can be mounted on an ASIC 170 (application-specific integrated circuit).

Figure 9B:
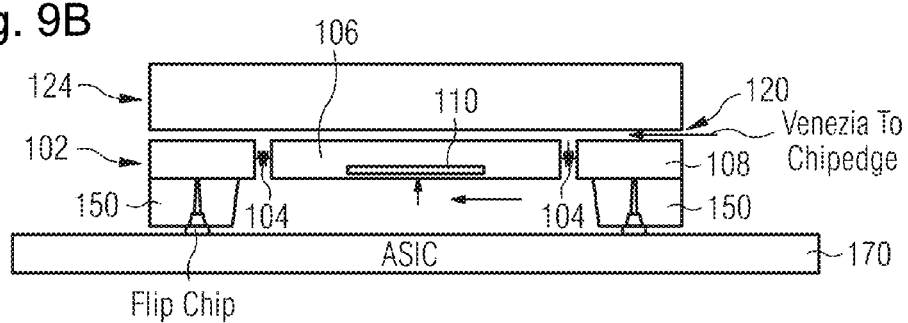
FIG. 9B shows a cross-sectional view of the absolute MEMS pressure sensor mounted in a flip chip manner on the ASIC.

FIG. 9B shows a cross-sectional view of the absolute MEMS pressure sensor 100 mounted in a flip chip manner on the ASIC. Thereby, the semiconductor substrate 102 can comprise a pressure port 120 arranged on a side surface 124 of the semiconductor substrate (chip) 102. The pressure port 120 can be obtained, for example, by performing the Venezia process up to the chip edge. Further, in FIG. 9B a pressure flow is indicated by arrows.

Figure 9C:
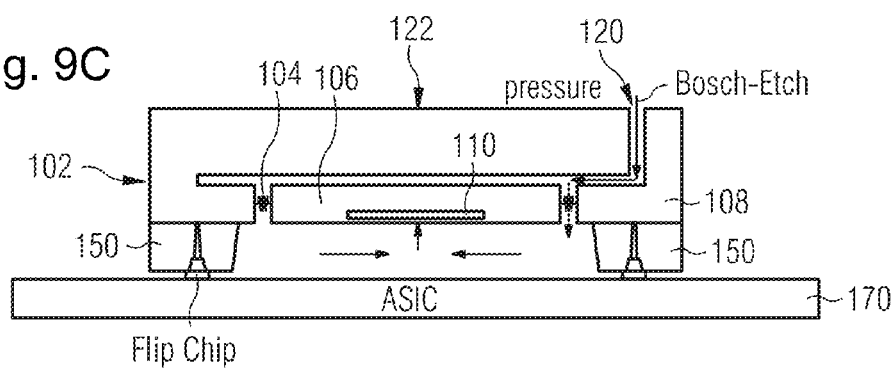
FIG. 9C shows a cross-sectional view of the absolute MEMS pressure sensor mounted in a flip chip manner on the ASIC.

FIG. 9C shows a cross-sectional view of the absolute MEMS pressure sensor 100 mounted in a flip chip manner on the ASIC. Thereby, the semiconductor substrate 102 can comprise a pressure port 120 arranged on a second surface 122 of the semiconductor substrate (chip) 102. The pressure port 120 can be obtained, for example, by performing a bosch etch from the second surface 122 of the semiconductor substrate 102 up to the third buried empty space. Further, in FIG. 9C a pressure flow is indicated by arrows.

The MEMS pressure sensor 100 shown in FIG. 9 requires only one wafer due to the used double Venezia stress decoupling (compared to conventional MEMS pressure sensors requiring a triple stack).

Embodiments provide two mayor characteristics which may influence the customer system. First, the MEMS pressure sensor 100 disclosed herein makes a stress decoupling to a straight forward approach. Second is the reduced device height, in contrast to conventional MEMS pressure sensors which use a triple wafer MEMS stack+ASIC, the MEMS pressure sensor disclosed herein is one wafer sensor. The MEMS pressure sensor disclosed herein reaches the same or even an improved shock resistance compared to conventional MEMS pressure approaches. This enables the customer to use much cheaper packages and save system costs.

Embodiments combine two silicon-on-nothing layers and designs to generate single crystalline piezo MEMS devices and realize an improved (or even perfect) stress decoupling of the same with a flexible pressure port design.

Although herein embodiments for manufacturing a MEMS pressure sensor using a double Venezia process were described, it noted that the double Venezia process also can be used for manufacturing other MEMS devices.

Embodiments provide a media robust relative pressure sensor with piezoresistive p-cell and front/backside pressure port. Embodiments provide minimum cost, maximum stress decoupling and good media robustness for automotive applications.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:
1. A Micro Electro Mechanical System (MEMS) pressure sensor comprising:
a semiconductor substrate,
wherein the semiconductor substrate comprises a stress decoupling structure adapted to stress decouple a first portion of the semiconductor substrate from a second portion of the semiconductor substrate,
wherein the first portion of the semiconductor substrate comprises a first buried empty space, wherein the second portion of the semiconductor substrate comprises a second buried empty space, and
wherein the semiconductor substrate comprises a buried pressure channel fluidically connecting the first buried empty space and the second buried empty space.

2. The MEMS pressure sensor according to claim 1, wherein the buried pressure channel runs within the stress decoupling structure.

3. The MEMS pressure sensor according to claim 1, wherein the stress decoupling structure is a spring structure adapted to spring-load the first portion of the semiconductor substrate.

4. The MEMS pressure sensor according to claim 1, wherein the first portion of the semiconductor substrate and the second portion of the semiconductor substrate are mechanically connected exclusively via the stress decoupling structure.

5. The MEMS pressure sensor according to claim 1, wherein the first portion of the semiconductor substrate and the second portion of the semiconductor substrate are separated from each other.

6. The MEMS pressure sensor according to claim 1, wherein the first portion of the semiconductor substrate and the second portion of the semiconductor substrate are portions of a same semiconductor substrate.

7. The MEMS pressure sensor according to claim 1, wherein the stress decoupling structure is part of the semiconductor substrate.

8. The MEMS pressure sensor according to claim 1, wherein the second portion of the semiconductor substrate comprises a U-shaped cavity in which the first portion of the semiconductor substrate is stress decoupledly loaded by the stress decoupling structure.

9. The MEMS pressure sensor according to claim 1, wherein the MEMS pressure sensor is configured to sense a pressure by sensing a piezo resistance of the first portion of the semiconductor substrate at least in a region laterally extending along the first buried empty space or a first surface of the first portion of the semiconductor substrate and vertically extending between the first surface of the first portion of the semiconductor substrate and the first buried empty space.

10. The MEMS pressure sensor according to claim 1, wherein the first buried empty space is formed in the first portion of the semiconductor substrate such that a region of the first portion of the semiconductor substrate extending between a first surface of the first portion of the semiconductor substrate and the first buried empty space forms a piezo resistive pressure membrane.

11. The MEMS pressure sensor according to claim 1, wherein the MEMS pressure sensor is a relative pressure sensor.

12. The MEMS pressure sensor according to claim 1, wherein the MEMS pressure sensor is configured to sense a relative pressure between a first pressure present in surroundings of the first portion of the semiconductor substrate and a second pressure present in the first buried empty space within the first portion of the semiconductor substrate.

13. The MEMS pressure sensor according to claim 12, wherein the semiconductor substrate comprises a pressure port for the second pressure, wherein the pressure port is fluidically connected to the second buried empty space.

14. The MEMS pressure sensor according to claim 1, wherein at least one out of the first buried empty space and the second buried empty space extends in a lateral direction substantially perpendicular to a first surface of the semiconductor substrate.

15. A method for manufacturing a Micro Electro Mechanical System (MEMS) pressure sensor, the method comprising:
providing a semiconductor substrate;
forming a decoupling structure in the semiconductor substrate, the decoupling structure being adapted to stress decouple a first portion of the semiconductor substrate from a second portion of the semiconductor substrate;
forming a first buried empty space in the first portion of the semiconductor substrate and a second buried empty space in the second portion of the semiconductor substrate; and
forming a pressure channel in the semiconductor substrate between the first buried empty space and the second buried empty space, wherein the pressure channel fluidically connects the first buried empty space and the second buried empty space.

16. The method for manufacturing according to claim 15, wherein the first buried empty space and the second buried empty space are formed in a first depth with respect to a first surface of the semiconductor substrate;
wherein forming the decoupling structure comprises forming a third buried empty space in the semiconductor substrate in a second depth with respect to the first surface of the semiconductor substrate, the second depth being greater than the first depth.

17. The method for manufacturing according to claim 16, wherein forming the decoupling structure comprises forming trenches in the semiconductor substrate from the first surface of the semiconductor substrate up to the third buried empty space thereby substantially separating the semiconductor substrate in the first portion and the second portion, wherein forming trenches in the semiconductor substrate comprises maintaining parts of the semiconductor substrate forming the decoupling structure.

18. The method for manufacturing according to claim 15, wherein forming the pressure channel comprises forming the pressure channel inside the decoupling structure.

19. The method for manufacturing according to claim 15, wherein the first buried empty space is formed within the first portion of the semiconductor substrate such that a region of the first portion of the semiconductor substrate extending between a first surface of the first portion of the semiconductor substrate and the first buried empty space forms a piezo resistive pressure membrane.

20. The method for manufacturing according to claim 19, wherein the method comprises providing contacts on the first portion of the semiconductor substrate contacting the piezo resistive pressure membrane.

21. The method for manufacturing according to claim 15, wherein the method comprises forming a pressure port in the semiconductor substrate from a surface of the semiconductor substrate or from a side of the semiconductor substrate up to the second buried empty space.

22. A method for manufacturing a Micro Electro Mechanical System (MEMS) device, the method comprising:
providing a semiconductor substrate;
forming a first buried empty space in the semiconductor substrate in a first depth with respect to a first surface of the semiconductor substrate;
forming trenches in the semiconductor substrate from the first surface of the semiconductor substrate up to the first buried empty space thereby substantially separating the semiconductor substrate in a first portion and a second portion, wherein forming trenches in the semiconductor substrate comprises maintaining parts of the semiconductor substrate forming a stress decoupling structure adapted to stress decouple the first portion of the semiconductor substrate from the second portion of the semiconductor substrate; and
forming a second buried empty space in the first portion of the semiconductor substrate in a second depth with respect to the first surface of the semiconductor substrate, wherein the first depth is greater than the second depth.

23. The method for manufacturing according to one of the claim 22, wherein the second buried empty space is formed within the first portion of the semiconductor substrate such that a region of the first portion of the semiconductor substrate extending between the first surface of the first portion of the semiconductor substrate and the second buried empty space forms a piezo resistive pressure membrane.

24. The method for manufacturing according to claim 22, wherein the method comprises:
providing a further substrate; and
mounting the semiconductor substrate in a flip chip manner on the further substrate, such that the semiconductor substrate is arranged with the first surface on the semiconductor substrate or on spacers arranged between the first surface of the semiconductor substrate and the further substrate.

25. The method according to claim 22, wherein the method comprises forming a pressure port from a second surface of the semiconductor substrate or a side surface of the semiconductor substrate up to the first buried empty space.

* * * * *